(12) United States Patent
Chen et al.

(10) Patent No.: US 11,818,869 B2
(45) Date of Patent: Nov. 14, 2023

(54) HEAT DISSIPATION STRUCTURE ASSEMBLY

(71) Applicants: Micro-Star Int'l Co., Limited., New Taipei (TW); MSI Electronic (Kun Shan) Co., Ltd., Kunshan (CN)

(72) Inventors: Cheng-Lung Chen, New Taipei (TW); Chia-Ming Chang, New Taipei (TW)

(73) Assignees: MICRO-STAR INT'L CO., LIMITED., New Taipei (TW); MSI ELECTRONIC (KUN SHAN) CO., LTD., Kunshan (CN)

( * ) Notice: Subject to any disclaimer, the term of this patent is extended or adjusted under 35 U.S.C. 154(b) by 171 days.

(21) Appl. No.: 17/516,098

(22) Filed: Nov. 1, 2021

(65) Prior Publication Data

US 2023/0007806 A1    Jan. 5, 2023

(30) Foreign Application Priority Data

Jun. 30, 2021    (CN) .................. 202110748402.X

(51) Int. Cl.
*H05K 7/20* (2006.01)
*H01L 23/427* (2006.01)
(Continued)

(52) U.S. Cl.
CPC ..... *H05K 7/20454* (2013.01); *H01L 23/4275* (2013.01); *G06F 1/203* (2013.01); *H01L 23/3736* (2013.01)

(58) Field of Classification Search
CPC .............. H05K 7/2039; H05K 7/20454; H01L 23/4275; H01L 23/3736; G06F 1/203
See application file for complete search history.

(56) References Cited

U.S. PATENT DOCUMENTS 7,498,203 B2 * 3/2009 Haga .................. H01L 23/24
438/122
9,420,734 B2 * 8/2016 Liu .................... H05K 9/0026
(Continued)

FOREIGN PATENT DOCUMENTS

WO    WO-2019112582 A1 *    6/2019

OTHER PUBLICATIONS

European search opinion for EP 4113247 (Year: 2022).*

*Primary Examiner* — Zachary Pape
*Assistant Examiner* — Steven Ngo
(74) *Attorney, Agent, or Firm* — Muncy, Geissler, Olds & Lowe, P.C.

(57) ABSTRACT

A heat dissipation structure assembly includes an elastic limiting member, a thermal grease wall, a fitting member, a phase-change metal, and an assembling plate. The elastic limiting member is adapted to be disposed at a periphery of a heat source. The thermal grease wall is adapted to be in contact with the periphery of the heat source. The fitting member is in contact with the thermal grease wall and engaged with the elastic limiting member. The phase-change metal is adapted to be filled into a region among the fitting member, the thermal grease wall, and the heat source. When a temperature of the phase-change metal exceeds a critical temperature, a state of the phase-change metal is changed to a liquid state. The assembling plate is connected to the fitting member, and the assembling plate is in contact with the thermal grease wall.

11 Claims, 3 Drawing Sheets

(51) Int. Cl.
*H01L 23/373* (2006.01)
*G06F 1/20* (2006.01)

(56) References Cited

U.S. PATENT DOCUMENTS

| | | | |
|---|---|---|---|
| 2003/0051868 A1* | 3/2003 | Dishongh | F28D 15/00 |
| | | | 165/185 |
| 2008/0001282 A1* | 1/2008 | Modi | H01L 21/563 |
| | | | 257/710 |
| 2019/0045666 A1* | 2/2019 | Liang | H01L 23/42 |
| 2020/0126887 A1* | 4/2020 | Lin | H01L 23/42 |
| 2020/0203254 A1* | 6/2020 | Dhane | H01L 23/3675 |
| 2020/0260609 A1* | 8/2020 | Saha | H01L 23/42 |
| 2020/0288604 A1* | 9/2020 | Wong | H01L 23/42 |
| 2021/0043544 A1* | 2/2021 | Eid | H03H 9/0542 |
| 2022/0216127 A1* | 7/2022 | Osenbach | H01L 21/50 |

\* cited by examiner

HEAT DISSIPATION STRUCTURE ASSEMBLY

CROSS-REFERENCE TO RELATED APPLICATION

This non-provisional application claims priority under 35 U.S.C. § 119(a) to Patent Application No. 202110748402.X filed in China, P.R.C. on Jun. 30, 2021, the entire contents of which are hereby incorporated by reference.

BACKGROUND

Technical Field

The instant disclosure relates to electronic fields, in particular, to a heat dissipation structure assembly applicable to a heat source assembled on a circuit carrier plate.

Related Art

As the efficiency of various electronic devices becomes higher and higher, the heat generated by the devices becomes larger and larger. If the heat source is not effectively exported, it may cause the electronic components inside the device to have thermal breakdown or malfunction, or even to cause the destruction of the entire electronic device.

SUMMARY

Taking the computer as an example, currently, the main heat source for the computer is the central processing unit (CPU) or the graphics processing unit (GPU). In general, a metal in liquid state is applied on the surface of the heat source and to contact a heat dissipation shell, so that the heat generated by the heat source can be exported rapidly through heat conduction. However, it is understood that the metal in liquid state is flowable. As a result, because of the carrying angles of the device or the shaking of the device, the metal in liquid state may flow to other places to cause inefficient heat dissipation. Moreover, when the metal in liquid state flows to other places to contact other components, short-circuit condition occurs.

In view of this, in one embodiment of the instant disclosure, a heat dissipation structure assembly applicable to a heat source assembled on a circuit carrier plate is provided. The heat dissipation structure assembly comprises an elastic limiting member, a thermal grease wall, a fitting member, a phase-change metal, and an assembling plate. The elastic limiting member is adapted to be disposed on the circuit carrier plate and to be at a periphery of the heat source, and the elastic limiting member has a first height. The thermal grease wall is adapted to be disposed on the circuit carrier plate, to be between the heat source and the elastic limiting member, and to be in contact with the periphery of the heat source. The thermal grease wall has a second height, the first height is greater than the second height, and the second height is greater than a height of the heat source. The fitting member is in contact with a top of the thermal grease wall and engaged with a side portion of the elastic limiting member. The phase-change metal is adapted to be filled into a region among the fitting member, the thermal grease wall, and the heat source. When a temperature of the phase-change metal exceeds a critical temperature, a state of the phase-change metal is changed to a liquid state. The assembling plate is connected to the fitting member, and a portion of the assembling plate is in contact with the top of the elastic limiting member.

In some embodiments, the heat source is a central processing unit (CPU) or a graphics processing unit (GPU).

In some embodiments, the critical temperature of the phase-change metal is in a range between 50° C. and 65° C. Preferably, in some embodiments, the critical temperature of the phase-change metal is in a range between 54° C. and 60° C.

In some embodiments, the elastic limiting member is an elastic foam.

In some embodiments, the fitting member is a copper block.

In some embodiments, the assembling plate is a metal plate.

In some embodiments, the assembling plate is adapted to be fixed on the circuit carrier plate.

In some embodiments, the fitting member and the assembling plate are soldered with each other to form a one-piece member.

In some embodiments, a thickness of the assembling plate is greater than a thickness of the fitting member.

In some embodiments, the heat dissipation structure assembly further comprises a second elastic limiting member adapted to be disposed on the circuit carrier plate and surrounding the elastic limiting member. According to one or some embodiments of the instant disclosure, the phase-change metal is utilized. Therefore, when the electronic device with heat source is not in use or is cooled, the phase-change metal has a lower flowability. Furthermore, through the assembling plate and the elasticity provided by the elastic limiting member, the flowable region of the phase-change metal is limited, and the phase-change metal can be prevented from spilling out of the region to affect the electrical connection of the components inside the electronic device.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
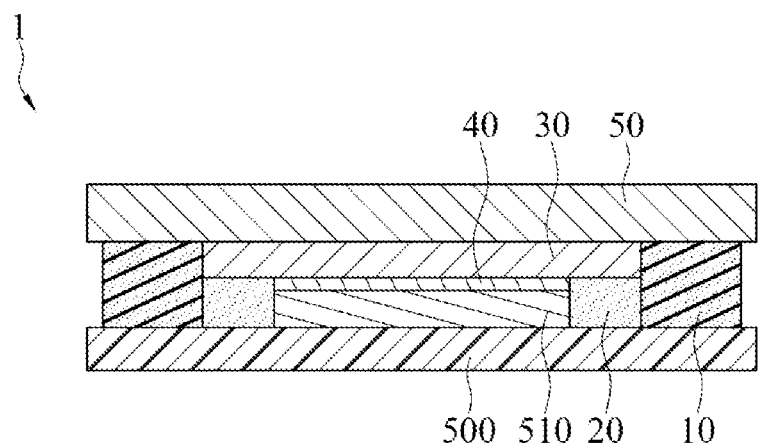
FIG. 1 illustrates a cross-sectional view of a heat dissipation structure assembly according to an exemplary embodiment of the instant disclosure.

The instant disclosure is further described below by way of specific embodiments. The accompanying drawings of the instant disclosure are for illustrative purposes only to facilitate a better understanding of the instant disclosure, and the practical scale of the components in the drawings may be adjusted according to design requirements. It should be understood that, persons having ordinary skills in the art can realize that the upper and lower relationship between component indicate the relative positions of the components; for sake of understanding easily, the upper surface of the component is regarded as the front surface, and the lower surface of the component is regarded as the back surface.

Figure 2:
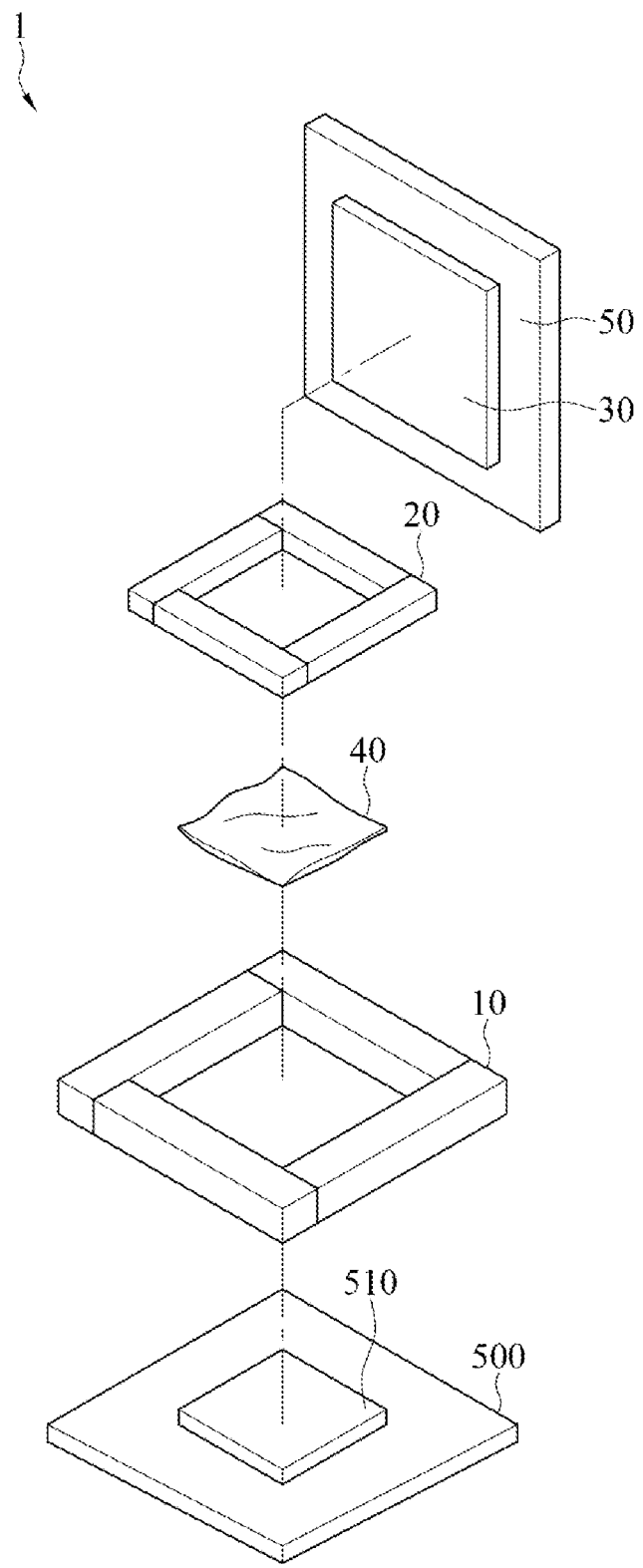
FIG. 2 illustrates an exploded view of the heat dissipation structure assembly of the exemplary embodiment.

FIG. 1 illustrates a cross-sectional view of a heat dissipation structure assembly according to an exemplary embodiment of the instant disclosure. FIG. 2 illustrates an exploded view of the heat dissipation structure assembly. As shown in FIG. 1 and FIG. 2, the heat dissipation structure assembly 1 is applicable to a heat source 510 assembled on a circuit carrier plate 500. The heat dissipation structure assembly 1 comprises an elastic member 10, a thermal grease wall 20, a fitting member 30, a phase-change metal 40, and an assembling plate 50.

The elastic limiting member 10 is adapted to be disposed on the circuit carrier plate 500 and at a periphery of the heat source 510. The elastic limiting member 10 has a first height. The thermal grease wall 20 is adapted to be disposed on the circuit carrier plate 500, between the heat source 510 and the elastic limiting member 10, in contact with the periphery of the heat source 510, and adjacent to the elastic limiting member 10. That is, the thermal grease wall 20 may be in contact with the elastic limiting member 10 or may be spaced apart from the elastic limiting member 10. The thermal grease wall 20 has a second height. The second height is greater than the first height, and the second height is greater than a height of the heat source 510. In some embodiments, the heat source 510 may be a central processing unit (CPU) or a graphics processing unit (GPU). The thermal grease wall 20 may be implemented by normal thermal pastes or other insulation thermal-conductive pastes with ceramic particle. The paste may be directly applied on the periphery of the heat source 510. Alternatively, in some embodiments, the paste may be filled into the space between the elastic limiting member 10 and the heat source 510 after the elastic limiting member 10 is disposed on the circuit carrier plate 500.

The fitting member 30 is in contact with a top of the thermal grease wall 20 and engaged with a side portion of the elastic limiting member 10. The phase-change metal 40 is filled into a region among the fitting member 30, the thermal grease wall 20, and the heat source 510. When the temperature of the phase-change metal 40 exceeds a critical temperature, the state of the phase-change metal 40 is changed to a liquid state. In some embodiments, the phase-change metal 40 is applied on the surface of the heat source 510 after the elastic limiting member 10 and the thermal grease wall 20 are arranged on the circuit carrier plate 500, and then the fitting member 30 is in contact with and positioned with the thermal grease wall 20, thus limiting the position of the phase-change metal 40.

The assembling plate 50 is connected to the fitting member 30, and a portion of the assembling plate 50 is in contact with the top of the elastic limiting member 10. In some embodiments, the fitting member 30 is a copper block, and the assembling plate 50 is a metal plate. Accordingly, in one or some embodiments of the instant disclosure, the heat generated by the heat source 510 can be transmitted outwardly through the phase-change metal 40, the fitting member 30, and the assembling plate 50 that are connected to each other, and then the heat energy can be removed by thermal pipe or fan (not shown).

In some embodiments, the fitting member 30 and the assembling plate 50 are soldered with each other to form a one-piece member. In other words, in these embodiments, the fitting member 30 and the assembling plate 50 are served as an outer cap, and the elastic limiting member 10, the thermal grease wall 20, and the phase-change metal 40 are assembled with the outer cap. Moreover, in some embodiments, the assembling plate 50 may be positioned on the circuit carrier plate 500 by, e.g., screws.

In some embodiments, the critical temperature of the phase-change metal 40 is in a range between 50° C. and 65° C. Preferably, in some embodiments, the critical temperature of the phase-change metal 40 is in a range between 54° C. and 60° C. In a further preferred embodiment, the critical temperature of the phase-change metal 40 is 58±0/5° C. In other words, if the electronic device (such as notebook computer and tablet computer) with the heat source 510 is powered off, or is turned off and cooled for a period of time, the state of the phase-change metal 40 is changed from the liquid state back to the solid state. Therefore, when the electronic device is being carrying or shaken, the phase-change metal 40 does not flow to prevent from spilling out of or detaching off the surface of the heat source 510.

In general, the surface of the heat source 510 may have concave or convex structures, or different portions of the surface of the heat source 510 may have height difference owing to the manufacturing tolerance. In some embodiments, the elastic limiting member 10 is an elastic foam. In some embodiments, the thickness of the assembling plate 50 is greater than the thickness of the fitting member 30. In other words, in these embodiments, the assembling plate 50 provides a greater weight to produce pressure. Therefore, no matter the heat source 510 has a lower height or a higher height, through the elasticity of the elastic limiting member 10, no gap is produced, and the phase-change metal 40 can be attached to the surface of the heat source 510 as much as possible to prevent from spilling out. Moreover, even if the thermal grease wall 20 has gaps to cause leakage of the phase-change metal 40, the elastic foam provides the absorbing function to prevent the phase-change metal 40 from leaking outside to affect the electrical connection between the components on the circuit carrier plate 500.

Figure 3:
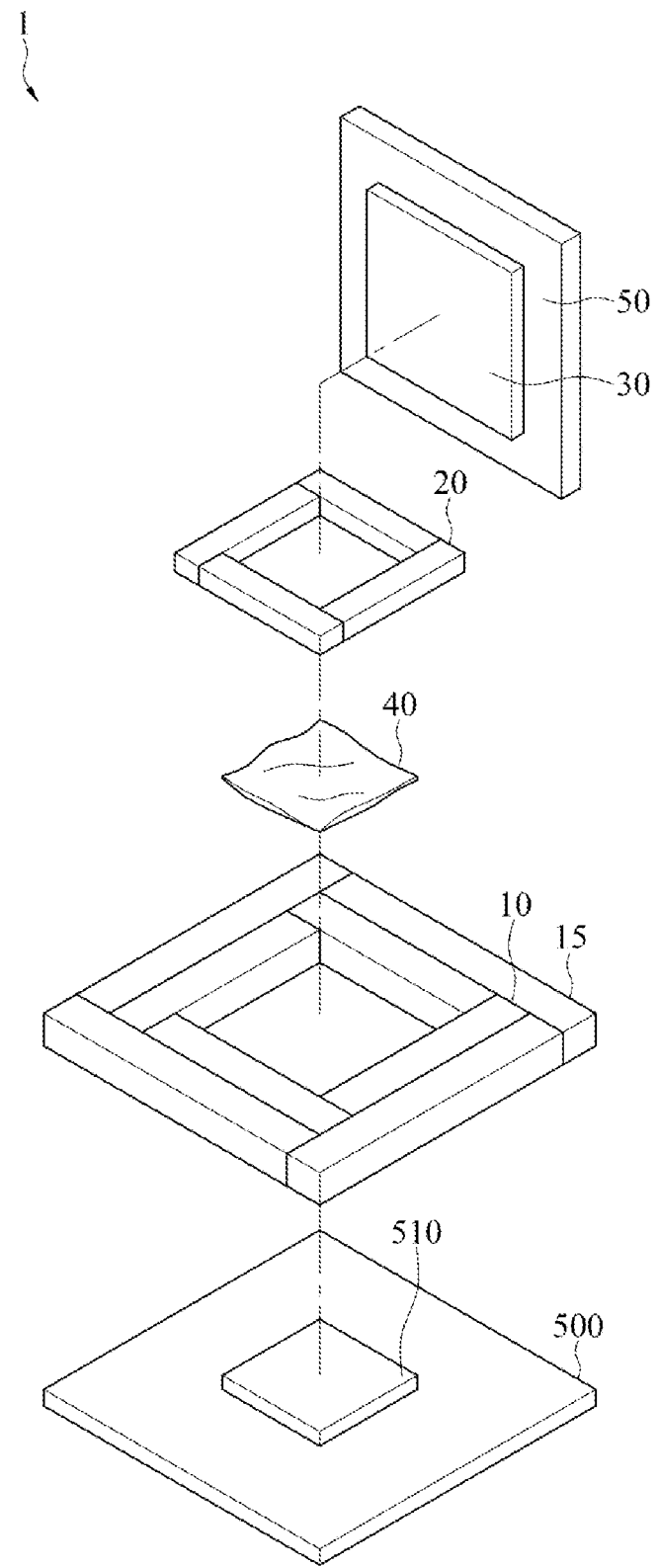
FIG. 3 illustrates an exploded view of a heat dissipation structure assembly according to another exemplary embodiment of the instant disclosure.

FIG. 3 illustrates an exploded view of a heat dissipation structure assembly according to another exemplary embodiment of the instant disclosure. As shown in FIG. 3, in some other embodiments, the heat dissipation structure assembly 1 further comprises a second elastic limiting member 15. The second elastic limiting member 15 is adapted to be disposed on the circuit carrier 500 and surrounds the elastic limiting member 10. The second elastic limiting member 15 and the elastic limiting member 10 may be the elastic foams, but not limited thereto. In some embodiments, the second elastic limiting member 15 may be made of materials which is elastic and has absorbing function. With the second elastic limiting member 15, the phase-change metal 40 can be prevented from leaking outside the heat dissipation structure assembly 1.

As above, according to one or some embodiments of the instant disclosure, the phase-change metal is utilized. Therefore, when the electronic device with heat source 510 is not in use or is cooled, the phase-change metal 40 has a lower flowability. Furthermore, through the assembling plate 50 and the elasticity provided by the elastic limiting member 10, the flowable region of the phase-change metal 40 is limited, and the phase-change metal 40 can be prevented from spilling out of the region to affect the electrical connection of the components inside the electronic device.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A heat dissipation structure assembly, applicable to a heat source assembled on a circuit carrier plate, wherein the heat dissipation structure assembly comprises:
   an elastic limiting member adapted to be disposed on the circuit carrier plate and to be at a periphery of the heat source, wherein the elastic limiting member has a first height;
   a thermal grease wall adapted to be disposed on the circuit carrier plate, to be between the heat source and the elastic limiting member, and to be in contact with the periphery of the heat source, wherein the thermal grease wall has a second height, the first height is greater than the second height, and the second height is greater than a height of the heat source;
   a fitting member in contact with a top of the thermal grease wall and engaged with a side portion of the elastic limiting member;
   a phase-change metal adapted to be filled into a region among the fitting member, the thermal grease wall, and the heat source, wherein when a temperature of the phase-change metal exceeds a critical temperature, a state of the phase-change metal is changed to a liquid state; and
   an assembling plate connected to the fitting member, wherein a portion of the assembling plate is in contact with a top of the elastic limiting member.

2. The heat dissipation structure assembly according to claim 1, wherein the heat source is a central processing unit or a graphics processing unit.

3. The heat dissipation structure assembly according to claim 1, wherein the critical temperature of the phase-change metal is in a range between 50° C. and 65° C.

4. The heat dissipation structure assembly according to claim 3, wherein the critical temperature of the phase-change metal is in a range between 54° C. and 60° C.

5. The heat dissipation structure assembly according to claim 1, wherein the elastic limiting member is an elastic foam.

6. The heat dissipation structure assembly according to claim 1, wherein the fitting member is a copper block.

7. The heat dissipation structure assembly according to claim 1, wherein the assembling plate is a metal plate.

8. The heat dissipation structure assembly according to claim 1, wherein the assembling plate is adapted to be fixed on the circuit carrier plate.

9. The heat dissipation structure assembly according to claim 1, wherein the fitting member and the assembling plate are soldered with each other to form a one-piece member.

10. The heat dissipation structure assembly according to claim 1, wherein a thickness of the assembling plate is greater than a thickness of the fitting member.

11. The heat dissipation structure assembly according to claim 1, further comprising a second elastic limiting member adapted to be disposed on the circuit carrier plate and surrounding the elastic limiting member.

* * * * *